United States Patent

Malenko et al.

[11] Patent Number: 5,867,019
[45] Date of Patent: Feb. 2, 1999

[54] POWER CABLE VOLTAGE TESTER

[75] Inventors: Bobby Robert Malenko; Clare Brooke Ferguson, both of Winnipeg, Canada

[73] Assignee: BMF Engineering Inc., Winnipeg, Canada

[21] Appl. No.: 735,582

[22] Filed: Oct. 23, 1996

[51] Int. Cl.[6] .................................................. G01R 27/26
[52] U.S. Cl. ........................ 324/72.5; 324/149; 324/522
[58] Field of Search ........................... 324/72, 72.5, 522, 324/555, 556, 149, 109, 126; 340/635

[56] References Cited

U.S. PATENT DOCUMENTS

| | | | |
|---|---|---|---|
| 3,555,420 | 1/1971 | Schwartz | 324/72.5 |
| 3,596,177 | 7/1971 | Butera | 324/72.5 |
| 3,806,803 | 4/1974 | Hall | 324/72.5 |
| 4,015,201 | 3/1977 | Chaffee | 324/149 |
| 5,144,227 | 9/1992 | Shaw | 324/149 |
| 5,446,393 | 8/1995 | Schaefer | 324/72.5 |
| 5,448,162 | 9/1995 | Beha | 324/72.5 |
| 5,612,616 | 3/1997 | Earle | 324/72.5 |
| 5,672,964 | 9/1997 | Vinci | 324/72.5 |

*Primary Examiner*—Maura Regan
*Attorney, Agent, or Firm*—Adrian D. Battison; Murray E. Thrift

[57] ABSTRACT

A test device for testing for the presence of voltage on an electrical power cable has a manually graspable handle and a probe mounted on the handle for projecting forwardly for engaging the power cable. The housing contains an electronic detection circuit responsive to signals from the probe for detecting presence of voltage on the cable and an indicator light for providing a warning indication in response to the detection of a voltage. The probe has a v-shaped mouth for surrounding the cable and a central rod for engaging into the cable. The mouth is retracted by pressure to expose the rod. The rod engages between the exposed neutral wires of one type of cable or into a punched hole in a cable of the type having a jacket.

8 Claims, 5 Drawing Sheets

POWER CABLE VOLTAGE TESTER

This invention relates generally to the testing of underground electrical utility distribution or power cables, and more particularly to the testing of cables to determine, out of a group of cables, which ones have electrical potential on them and which ones do not.

BACKGROUND OF THE INVENTION

Electrical utility service distribution and the increasing use of underground cables provides a convenience, safety factor, and cost saving to the public and electrical utility companies. Disrupted service and scheduled maintenance requires the investigation, diagnosis and repair of the cables plus their associated connection points, such as sub stations, distribution centers and pad mounted transformers.

For any maintenance work to be conducted on underground cables, requires some method of indication to the service personnel as to whether the cable has any electrical potential on it. That is, whether the cable in question is "live or dead". Existing instruments are difficult to use and often the indication is inconclusive. The final step prior to cutting a primary cable, is to spike it. This requires a spiking tool that is to be used only after the cable is proven "dead" and grounded at both ends.

SUMMARY OF THE INVENTION

It is an object of the present invention to provide an instrument that accurately indicates the condition of live underground concentric neutral cables. Preferably the apparatus should be compact, non-destructive to the cable, rugged and safe to use and should be able to test a variety of underground concentric neutral cables and be easy to use.

According to the present invention there is provided apparatus for testing for the presence of voltage on an electrical power cable comprising: a manually graspable handle; a probe mounted on the handle for movement therewith for engaging the power cable; a housing carried by the handle; electronic detection means mounted in the housing and responsive to signals from the probe for detecting presence of voltage on the cable; and indicator means for providing a warning indication in response to the detection of a voltage.

Preferably the probe comprises a first member having a receptacle surface for engaging an outside surface of the cable and a second elongate probe element having a forward end for engaging into an opening on the cable.

Preferably the receptacle surface of the first member is generally concave to engage around a cylindrical outer surface of the cable and to contact the cable at angularly spaced points thereon.

Preferably the first member has two arms each for engaging the cable surface and the second element is located between the two arms with the arms defining a substantially V-shaped surface for presentation toward the cable.

Preferably the receptacle surface is conductive and includes two side edges arranged so as to be spaced longitudinally of the cable each side edge being arranged for engaging the cable surface.

Preferably the second element is mounted on the housing for sliding movement relative to first member so as to be moveable from a retracted position to a position extended from the first member for engaging onto the cable surface and the first member is mounted on the housing for retraction movement relative to the housing and the elongate probe is fixed relative to the housing such that the first member is retracted by application thereto of pressure from contact with the cable. Preferably the first member defines a tube in which the second element slides.

Preferably the housing includes a barrel portion extending forwardly from the handle with said probe mounted at a forward end of the barrel portion and projecting forwardly therefrom for engaging the cable and the handle is inclined rearwardly and downwardly from the barrel portion with the handle including a hand guard loop forwardly thereof and extending from a bottom of the handle to the barrel portion at a position thereon forwardly of the handle.

Preferably the electronic detection means comprises an input filter for removing external electromagnetic fields from the signal from the probe, then amplifying the signal with more filtering to a final indication of the presence of potential with audible and visual indicators.

According to a second aspect of the invention there is provided an apparatus for testing for the presence of voltage on an electrical power cable comprising: a housing; a probe mounted on the housing for movement therewith for engaging the power cable; electronic detection means mounted in the housing and responsive to signals from the probe for detecting presence of voltage on the cable; and indicator means for providing a warning indication in response to the detection of a voltage; wherein the probe comprises a first member having a receptacle surface for engaging an outside surface of the cable and a second elongate probe element having a forward end for engaging into an opening in the cable; wherein the receptacle surface of the first member is generally concave to engage around a cylindrical outer surface of the cable and to contact the cable at angularly spaced points thereon; wherein the second element is mounted on the housing for sliding movement relative to the first member so as to be moveable from a retracted position to a position extended from the first member for engaging onto the cable surface.

According to a third aspect of the invention there is provided a method for testing for the presence of voltage on an electrical power cable comprising: providing a cable having an outer jacket, an inner conductor, a layer of insulation surrounding the conductor and a neutral return conductor surrounding the insulation and inside the jacket; providing a tool having a manually graspable handle, a housing carried by the handle and a probe mounted on the handle for movement therewith for engaging the power cable; providing on the probe a first member having a receptacle surface for engaging an outside surface of the cable and a second elongate probe element having a forward end face; providing a punch and using the punch to punch a hole in the outer jacket of the cable, the punch having a size so as to form a hole substantially equal in size to the end face of the second element of the probe such that the second element can extend through the hole while the first member engages the outside surface of the jacket; providing electronic detection means mounted in the housing and responsive to signals from the probe for detecting presence of voltage on the cable; and providing indicator means for providing a warning indication in response to the detection of a voltage.

The improved concentric neutral cable tester therefore functions to indicate whether the cable has a voltage potential, that is whether it is live or dead. This new process of live underground concentric neutral cable indication has resulted in a non-destructive and rugged underground cable field tester. This new tester can allow rapid widespread tests by operating personnel for energized cables without any damaging results to the cable. The new design is resistant to surrounding E.M.I. fields, which can cause erroneous indications, thus enhancing its reliability. There is no field assembly or additional parts required, making the instrument very easy to use.

The instrument preferably is in the shape of a pistol grip handle, which is small, lightweight and is resistant to high impact field use. A safety feature of the instrument, is its protective hand guard built into the water resistant housing. The hand guard has a large enough gap from the instrument housing so as to allow utility service personnel the use of protective gloves as is usually required with high voltage work.

Another preferable feature of the instrument is a test of the instrument electrical circuits and the internal battery condition which can be conducted by pressing the self-check switch. This should be done prior to any cable check. The internal electronics provide battery polarity protection in the event a new battery is improperly installed.

The battery used in the instrument is preferably a single, 9 volt battery. It is preferably arranged so that there is no drain on the battery until the instrument is actually indicating an energized cable or the instrument self-check is activated. The unit will preferably sense any system voltage above 150 VAC.

The instrument can preferably be used on cross link with concentric neutral (no jacket), cross link with concentric neutral (with jacket) and cross link with concentric neutral copper tape shield (with jacket) cables.

Other features and advantages of the present invention will become apparent from the following description of the preferred embodiment taken in conjunction with the accompanying drawings which illustrates, by way of example, the principle of the invention.

DETAILED DESCRIPTION OF THE PREFERRED EMBODIMENT

Figure 1:
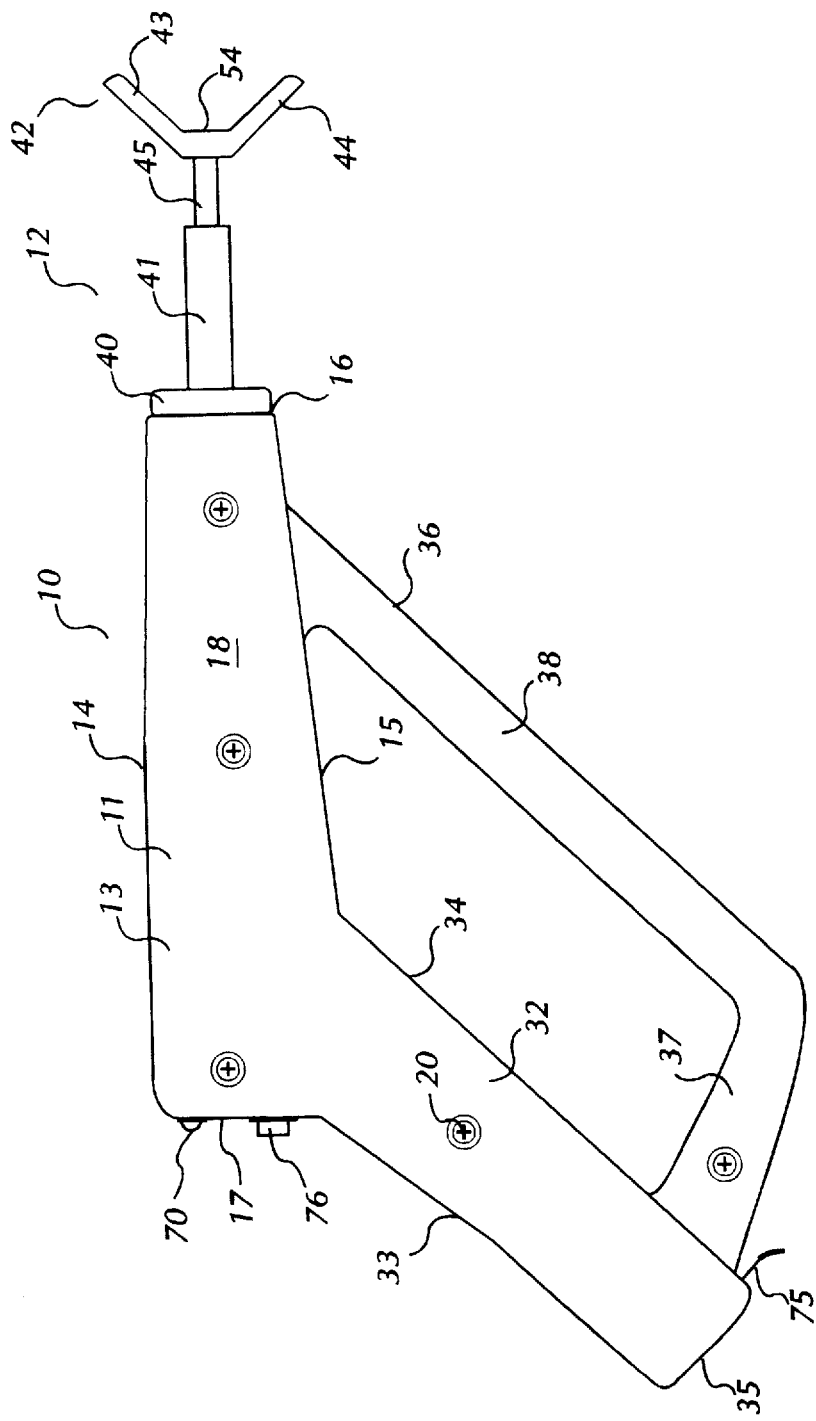
FIG. 1 is a side elevational view of an underground cable potential indicator instrument embodying the invention shown with the retractable jaw extended in its non-operative position.

The indicator generally indicated at 10 comprises a housing portion 11 and a probe 12 located in a forward end of the housing portion. The housing portion 11 includes a main body 13 which has a horizontal upper surface 14 and a lower surface 15 which extends forwardly and gradually upwardly so as to taper toward a forward end 16 of the housing. A vertical rear surface 17 of the housing is opposed to the forward end 16. The housing further includes vertical side walls 18. The housing is formed in two parts which fasten together along a center line (not shown) which are fastened together by screws 20 which engage into seats 31 arranged on the inside surface of the opposite half of the housing (which is not visible in FIGS. 1 and 2 but is shown in FIG. 3).

The housing further includes a pistol grip section 32 which connects at its upper end to the rear wall 17 and to a rear end of the bottom wall 15 and extends therefrom downwardly and rearwardly. The pistol grip section thus includes an upper wall 33 which joins with the rear wall 17 and a front wall 34 which joins with the bottom wall 15. These walls extend in generally parallel relationship to a lower end wall 35 which is substantially at right angles to the walls 33 and 34. The pistol grip section 32 is arranged so that when it is grasped by the hand of a user, this comfortably locates the main section 13 extending forwardly from the hand of the user so the probe can be presented forwardly away from the hand.

In front of the front wall 34 of the pistol grip is provided a protective guard 36. The protective guard includes a forwardly and downwardly extending portion 37 and a second portion 38 substantially at right angles to the portion 37 and generally parallel to the front wall 34 of the pistol grip portion. The first portion 37 connects to the lower end of the front wall 34 and the upper end of the second portion 38 connects to the lower wall 15 at a position adjacent to but spaced rearwardly from the forward end 16. The open loop area defined between the wall 34 and the guard is sufficiently large to receive the gloved hand of a user.

The probe 12 comprises a probe base 40 attached to the forward end wall 16 of the housing. The probe base 40 carries a cylindrical probe guide 41 which projects forwardly from the base and is rigidly attached thereto in fixed position relative thereto. On the probe guide 41 is mounted a first probe member 42 having a pair of arms 43 and 44 and a mounting boss 45.

The probe further includes a second probe member 46 in the form of an elongate rod. The elongate rod has an outer tubular sleeve attached thereto formed of a plastics material 47 thus defining an insulation for the outer cylindrical surface of the rod. A forward end of the rod indicated at 48 carries a layer of silver indicated at 49 which thus defines a relatively small circular probe face for engaging the cable sample as discussed hereinafter. The rod forming the second probe member 46 extends from the forward end 48 along a line longitudinal of the housing to a rearward end 50 contained within the housing and just rearward of the base 40. The rod thus acts as a conductor from the front probe face through to the interior of the housing for communicating currents. The rod is fixedly mounted onto a printed circuit board 74 so that its forward face 48 remains at a fixed spacing from the base 40 despite pressure against the forward face from contact with the cable.

Figure 2:
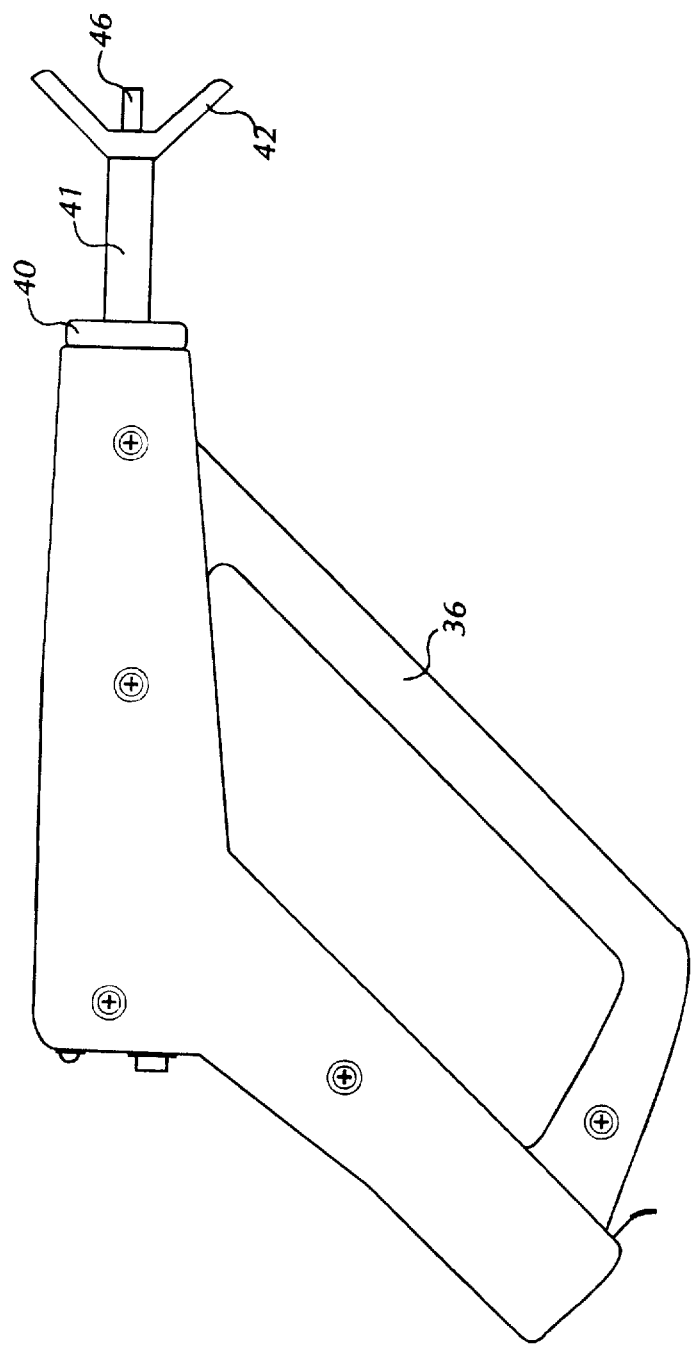
FIG. 2 is a similar side elevational view of an underground cable potential indicator instrument shown with the retractable jaw retracted in its operative position while testing a cable so that the probe is fully exposed in the operative position.
Figure 3:
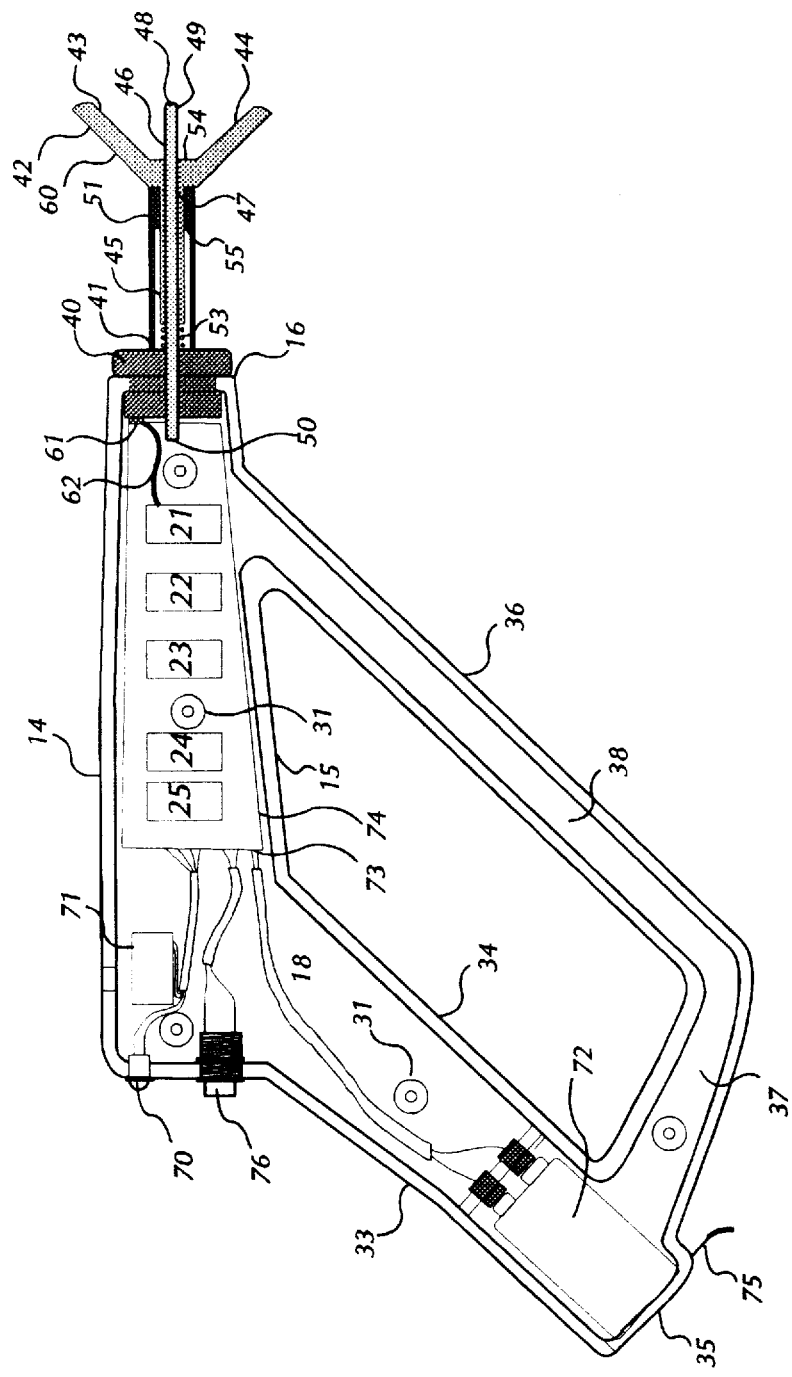
FIG. 3 is a cross-sectional view of the indicator of FIGS. 1 and 2 in its extended position.
Figure 4:
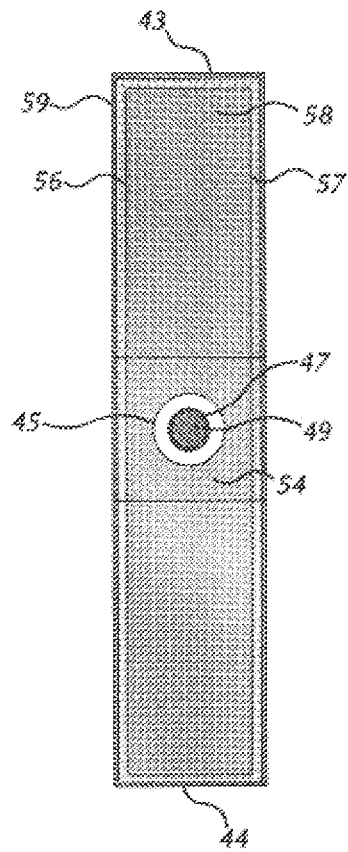
FIG. 4 is a front elevational view of the indicator of FIGS. 1 and 2.

The cylindrical boss 45 of the first probe member surrounds the outer surface of the insulation layer 47 on the rod 46 and can thus slide forwardly and rearwardly along the outside surface of the rod from the extended position shown in FIG. 1 to the retracted position shown in FIGS. 2 and 3. The outside surface of the cylindrical boss 45 slides against an inside surface 51 of the probe guide sleeve 41.

In the space between the inside surface of the guide sleeve 41 and the outside surface of the rod 46 is housed a cylindrical compression spring 53 which abuts at one end to the front face of the base 40 and at an opposed end to a flared bottom end of the cylindrical boss 45. The spring 53 thus biases the first probe member outwardly to the position shown in FIG. 1 in which the front end face 48 of the second probe member is just contained in an end face 54 of the first probe member. In this position a stop member 55 prevents further outward movement of the first probe member by abutting a shoulder provided within the tubular guide sleeve 41.

The first probe member is formed such that the arms 43 and 44 and the boss 45 are formed of a conductive material preferably copper. Each of the arms 43 and 44 comprises a pair of parallel side plates 56 and 57 separated by a central area 58. The side plates project forwardly from the arms and thus define two parallel contact surfaces for engaging a cylindrical outside surface of the cable.

On the two side surfaces of the sides 56 and 57 which are outward of the arms is applied an insulating layer 59 and an insulating layer also extends across a back of the respective arm as indicated at 60. Thus the only surfaces of the arms which are exposed for contacting the cable are the front faces of the sides 56 and 57.

The arms diverge forwardly and outwardly from the boss and thus the front faces of the arms defined by the sides 56 and 57 are generally V-shaped in side elevation thus forming a concave area for engaging around a cable. The sides are straight in side elevation thus forming a V-shape with a flat base defined by the surface 54. In this way a part of each arm will engage the outside surface of a cylindrical cable in tangential contact regardless of the diameter of the cable concerned.

It will be appreciated that the amount of movement of the first probe member sliding within the guide sleeve 41 until the front face 48 of the second probe member engages the outside surface of the cable depends upon the diameter of the cable.

Inside the housing is provided a terminal 61 connected by a conductor 62 to the neutral return side of the Printed Circuit Board 74 and filter 21. Also terminal 61 is connected to base 40 which in turn is conductively connected to the first probe member 42 via the boss 45.

The end 50 of rod 46 is attached via silver soldering to the front of PCB 74 providing a conductive path from the silvered probe surface 48 to the first filter 21.

A potential difference is provided across terminal 61 and end 50 of rod 46 which is determined by the potential difference between the silvered probe surface 48 and the contact points of the arms 43 and 44.

The terminal 61 and the end 50 of the rod 46 are connected by conductors on the PCB to a first filter 21 which acts to filter extraneous voltages generated by electromagnetic fields different from the electromagnetic field generated by the currents at the probe. An output from the filter 21 is communicated to first, second and third stage amplifiers as indicated at 22, 23 and 24 respectively. An output from the amplifier 24 is connected to a second stage filter 25 which again acts to filter out the potential generated by the electromagnetic fields different from the field of the cable. An output from the second stage filter 25 is communicated to an audible buzzer alarm 71 and to an illuminated LED alarm 70.

A 9 volt battery 72 provides power to a suitable input 73 on the circuit board 74 carrying the filter stages 21 and 25 and the amplifier stages 22, 23 and 24. The battery is held in place by a retainer clip 75.

A self-test switch 76 can be operated to apply a signal to the second stage filter 25 on manual operation of the switch 75 so that the proper operation of the circuit elements on the circuit board 74 can be monitored.

Figure 5:
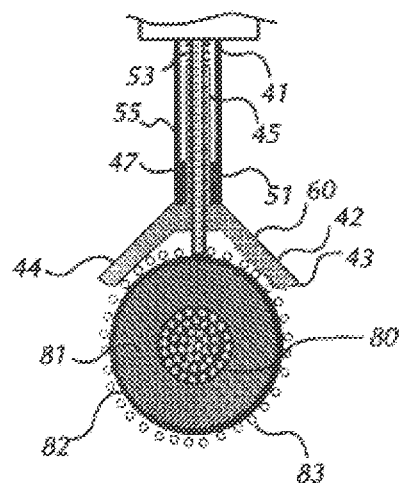
FIG. 5 is a first cross-sectional view through a cable showing the indicator in operation.

A conventional cable is shown in FIG. 5. The cable includes a central conductor 80 surrounded by a layer of insulation material 81. Around the insulation material is extruded a continuous layer 82 of a semiconducting insulation shield material. A neutral return is formed by a plurality of braided or wrapped non magnetic wires 83 surrounding the semiconducting layer 82.

Figure 6:
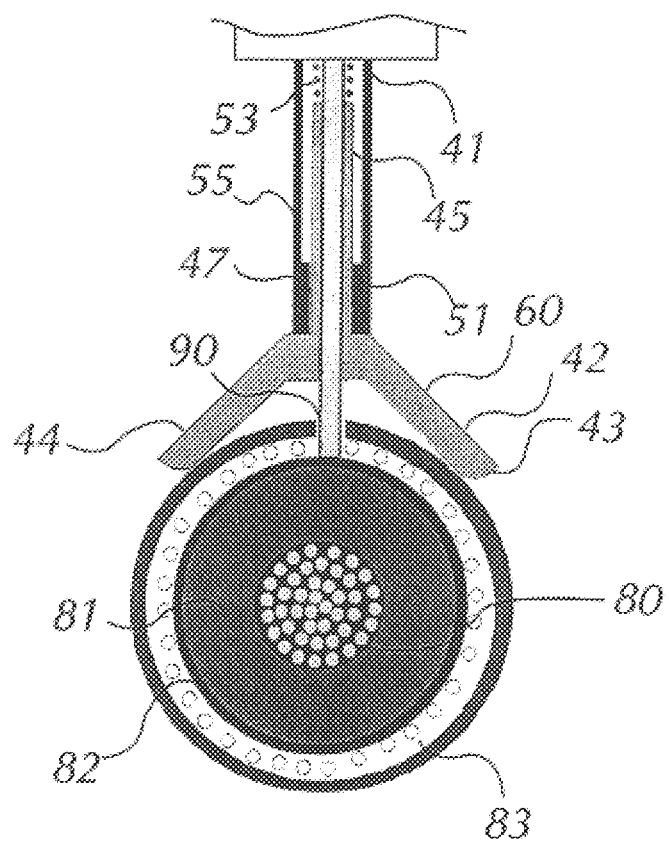
FIG. 6 is a second cross-sectional view through a cable showing the indicator in operation.

A further type of cable shown in FIG. 6 is well known in which the construction is very similar to that shown in FIG. 5 except that an external plastic jacket is extruded so as to cover the braided or wrapped wires 83 on the exposed outside surface of the cable.

A yet further type of cable shown in FIG. 7 is again well known in which the construction is very similar to that shown in FIG. 5 except around the insulation material is wrapped a continuous layer of a copper conductor which is overlapped along a longitudinal seam so that the copper conductor fully surrounds the insulating material. An extruded plastic jacket covers the outside of the copper layer.

Figure 7:
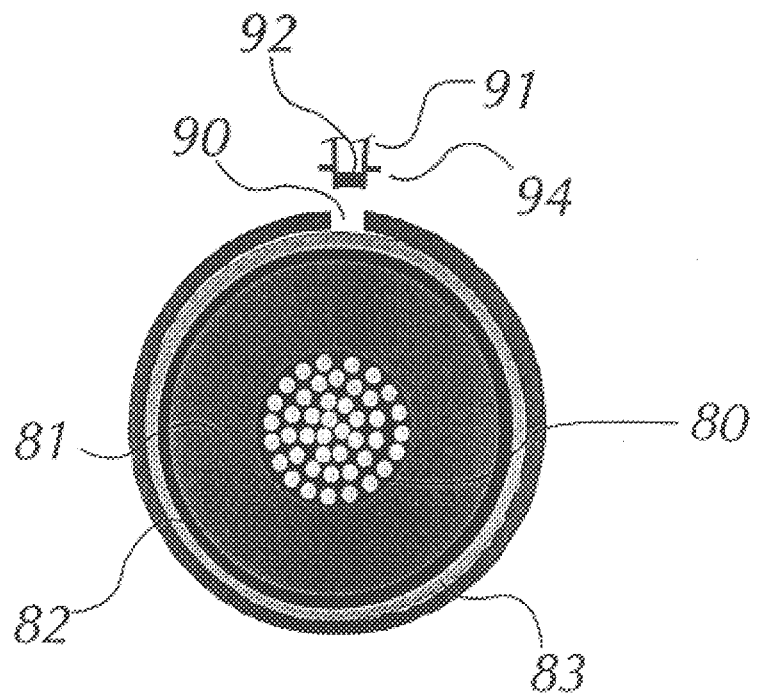
FIG. 7 is a first cross-sectional view through a cable showing a punch for generating a small hole for receiving the probe of the indicator.

In operation, when using the cable types shown in FIGS. 6 and 7, a hole 90 is formed by a punch 91 which extracts a core portion 92 of the jacket when the punch is driven into the outside surface of the jacket. The punch is of a type which does not allow penetration into the copper layer 82 which simply cuts through the plastics material of the extruded jacket. For this purpose, the punch has a flange 94 defining a shoulder which limits the extent of penetration of the punch into the cable.

With the core portion 92 removed leaving the hole 90, the probe is brought up into position adjacent the cable so that the probe lies with the longitudinal axis of the probe radial to the cable at the hole 90. The probe is then manually pushed forwards along the longitudinal direction toward the conductor 80 so that the arms 43 and 44 engage around the outside surface of the cable and move into contact with the outside surface of the tangential contact position previously described. This contact pushes the arms rearwardly until the second probe portion passes through the hole 90 so that the probe portion can engage against either the neutral return or through the neutral return onto the insulating material 81. In the arrangement shown in FIG. 7, the probe of course contacts the outside surface of the copper layer.

In this position, if the cable is live, a potential difference is generated between the conductor of the first probe member and the conductor of the second probe member so that this potential difference can be measured by the electronic element previously described to provide a visual and audible warning to the user. If the cable is not alive, no such potential difference is generated between the probe members.

In the arrangement shown in FIGS. 6 and 7, the potential difference is generated between the voltage at the second probe member which is at or adjacent the conductors and the first probe member which is external of the jacket.

In the arrangement shown in FIG. 5 in which the cable has no external jacket, the second probe member is manipulated so that it passes between the wrapped wire neutral into contact with the semi-conducting material 82. In this arrangement with the jacket omitted, the arms 43 and 44 thus come into contact with the wires of the neutral return while the end face of the probe engages the semi-conducting material 82. This arrangement therefore again provides a potential difference between the first and second probe members.

The instrument is small, lightweight (less than ½ lb.) and is high impact resistant. There is no field assembly or additional parts required, making the instrument very easy to use. The hand guard 36 is built into the water resistant pistol grip housing 32, enhancing the safety aspect of the instrument by providing protection to the operators hand from coming in contact with any energized cable being tested. The probe 12 does not penetrate the insulation of any underground cables and only a small punch hole is required through the outer jackets on cross link with concentric neutral and copper tape sheathed cables, thus enhancing the safety aspect, reducing costs and down time. No major cable repairs are required after testing, other than filling the small punch hole with sealant on jacketed cables and several layers of appropriate tape. The metal punch and sealant are an ancillary piece carried in the instrument case to facilitate the small punch hole required for the jacketed cables.

There are two energized cable indications; a positive visual LED 70 and an audible TONE indicator 71. A test of the instruments electrical system and the internal battery can be conducted by pressing the self check switch 76. This test is carried out prior to any cable check to ensure the validity of the instrument. The internal electronics 74 provide battery polarity protection in the event a new battery 72 is improperly installed. The battery 72 used in the instrument is a single, standard 9 volt battery located within the handle 32 portion of the housing 10. There is no drain on the battery 72 until the instrument is actually indicating an energized cable or the instrument self-check 76 is activated. The unit will sense any system voltage above a 150 VAC. The instrument can be used on: cross link with concentric neutral (no jacket), cross link with concentric neutral (with jacket) and cross link with concentric neutral copper tape shield with jacket.

To test concentric neutral cables, the test instrument is removed from its case and the test button pressed. Both the audible and visual alarms must come on. This indicates that the instrument is functioning properly. The jaws of the sensing element are simply straddled over the cable under test and downward pressing of the instrument places the sensing probe between the concentric neutral wires and in contact with the semi-conductor surface to test the cable. The instrument will then indicate if the cable is energized. The two energized cable indications are: a positive visual led and an audible tone.

The V-shaped jaws 43 and 44 are made up of copper set at a 70° angle to encompass all diameters of underground cables. The raised edges of the jaw provide excellent contact with the concentric neutral wires on all underground cables. To further provide a good contact, the raised edges are silver plated. This prohibits the copper edges from oxidizing and thus preventing intermittent test conditions. By placing the instrument jaws of the sensing element to straddle the concentric neutral cable and pressing further downward of the instrument, places the sensing probe in contact with the semi-conductive material of the cable under test.

The foregoing description of the present invention provides an improved hand held underground cable potential indicator that is fully self-contained an elongated probe is reciprocally movable between a retracted position, located fully within the indicator housing, and an extended position, located exterior to the housing.

Although the invention has been described in detail with reference only to the preferred embodiment, those of ordinary skill in the art will be able to carry out the requirements of the instrument. Accordingly, the invention is defined only by the following claims.

We claim:

1. Apparatus for testing for the presence of voltage on an electrical power cable comprising:
    a manually graspable handle;
    a probe mounted on the handle for movement therewith for engaging the power cable;
    a housing carried by the handle;
    electronic detection means mounted in the housing and responsive to signals from the probe for detecting presence of voltage on the cable;
    and indicator means for providing a warning indication in response to the detection of a voltage;
    the probe including a first receptacle member having an electrically conductive engagement surface facing forwardly of a longitudinal axis of the probe and arranged for engaging an outside surface of the cable and having a bore extending along the axis;
    and the probe including a second elongate probe element received within the bore in the first receptacle member with a peripheral surface and a forward end face for engaging into an opening in the cable;
    the second probe element and the first receptacle member being mounted for relative sliding movement in the axial direction from a rearward retracted position of the probe element in the bore to a forward probe position of the probe element and being spring biased toward the retracted position:
    the forward end face of the second probe element being electrically conductive for engaging the cable and the peripheral surface of the second probe element including thereon an electrically insulated material such that the forward end face is electrically insulated from the first receptacle member.

2. The apparatus according to claim 1 wherein the engagement surface of the first member is generally concave to engage around a cylindrical outer surface of the cable and to contact the cable at angularly spaced points thereon.

3. The apparatus according to claim 2 wherein the first member has two arms for engaging the cable surface the arms extending radially of the axis to respective sides of the probe element with the engagement surface defined by a forward facing surface of each arm.

4. The apparatus according to claim 3 wherein the forward facing surfaces of the arms define in an axial plane a substantially V-shaped surface for presentation toward the cable.

5. The apparatus according to claim 1 wherein the first receptacle member is mounted on the housing for retraction movement relative to the housing and the second probe element is fixed relative to the housing such that the first receptacle member is retracted by application thereto of pressure from contact with the cable.

6. The apparatus according to claim 1 wherein there is provided a punch having a central hole for punching and removing a plug portion from the outer jacket of the cable to define a hole in the outer jacket of the cable, the punch having the central hole thereof dimensioned to define a plug portion of a size so as to form a hole substantially equal in size to an end face of the second element of the probe such that the second element can extend through the hole while the first member engages the outside surface of the jacket.

7. Apparatus for testing for the presence of voltage on an electrical power cable comprising:
    a housing,
    a probe mounted on the housing for movement therewith for engaging the power cable;

electronic detection means mounted in the housing and responsive to signals from the probe for detecting presence of voltage on the cable;

and indicator means for providing a warning indication in response to the detection of a voltage;

the probe including a first receptacle member having an electrically conductive engagement surface facing forwardly of a longitudinal axis of the probe and arranged for engaging an outside surface of the cable;

and the probe including a second elongate probe element with a forward end face for engaging into an opening in the cable;

the second probe element and the first receptacle member being mounted for relative movement in a direction along an axis of the probe from a rearward retracted position of the probe element in the bore to a forward probe position of the probe element;

the forward end face of the second probe element being electrically conductive for engaging the cable and the forward end face being electrically insulated from the first receptacle member;

wherein the first receptacle member has two arms for engaging the cable surface, the arms extending radially of the axis to respective sides of the probe element with the engagement surface defined by a forward facing surface of each arm;

and wherein the forward facing surfaces of the arms define in an axial plane a substantially V-shaped surface for presentation toward the cable.

8. Apparatus for testing for the presence of voltage on an electrical power cable having an outer jacket, an inner conductor, a layer of insulation and semi-conductive material surrounding the conductor and a neutral return conductor surrounding the insulation and inside the jacket; the apparatus comprising:

a tool having a manually graspable handle, a housing carried by the handle and a probe mounted on the handle for movement therewith for engaging the power cable;

the probe having thereon a first member having a receptacle surface for engaging an outside surface of the cable and a second elongate probe element having a forward end face;

a punch having a central hole for punching and removing a plug portion from the outer jacket of the cable to define a hole in the outer jacket of the cable, the punch having the central hole thereof dimensioned to define a plug portion of a size so as to form a hole substantially equal in size to the end face of the second element of the probe such that the second element can extend through the hole while the first member engages the outside surface of the jacket;

electronic detection means mounted in the housing and responsive to signals from the probe for detecting presence of voltage on the cable;

and indicator means for providing a warning indication in response to the detection of a voltage.

* * * * *